United States Patent [19]

Steele

[11] Patent Number: 5,121,359

[45] Date of Patent: Jun. 9, 1992

[54] CONFIGURATION MEMORY FOR PROGRAMMABLE LOGIC DEVICE

[75] Inventor: Randy C. Steele, Southlake, Tex.

[73] Assignee: SGS-Thomson Microelectronics, Inc., Carrollton, Tex.

[21] Appl. No.: 502,571

[22] Filed: Mar. 30, 1990

Related U.S. Application Data

[63] Continuation-in-part of Ser. No. 414,712, Sep. 29, 1989.

[51] Int. Cl.⁵ .................................................. G11C 7/00
[52] U.S. Cl. ............................. 365/229; 365/189.08
[58] Field of Search ...................... 365/229, 189.08; 371/66; 307/64, 66

[56] References Cited

U.S. PATENT DOCUMENTS

| | | | |
|---|---|---|---|
| 3,859,638 | 1/1975 | Hume, Jr. | 365/229 |
| 4,288,865 | 9/1981 | Graham | 365/229 |
| 4,710,905 | 12/1987 | Uzhida | 365/229 |

Primary Examiner—Joseph A. Popek
Attorney, Agent, or Firm—Kenneth C. Hill; Lisa K. Jorgenson; Richard K. Robinson

[57] ABSTRACT

A programmable logic integrated circuit device utilizes volatile memory elements such as SRAM for retaining configuration information. A circuit is provided as part of the device for detecting loss of power on a supply input pin. When power loss is detected, a backup voltage supply, packaged with the programmable logic device as a unit, is connected thereto. The backup power is used to supply voltage only to those portions of the device having volatile memory elements containing configuration information. Backup power is not provided to input and output buffers of the device, thereby preventing excess loads being placed upon the backup device because of events which may occur external to the programmable logic device.

4 Claims, 2 Drawing Sheets

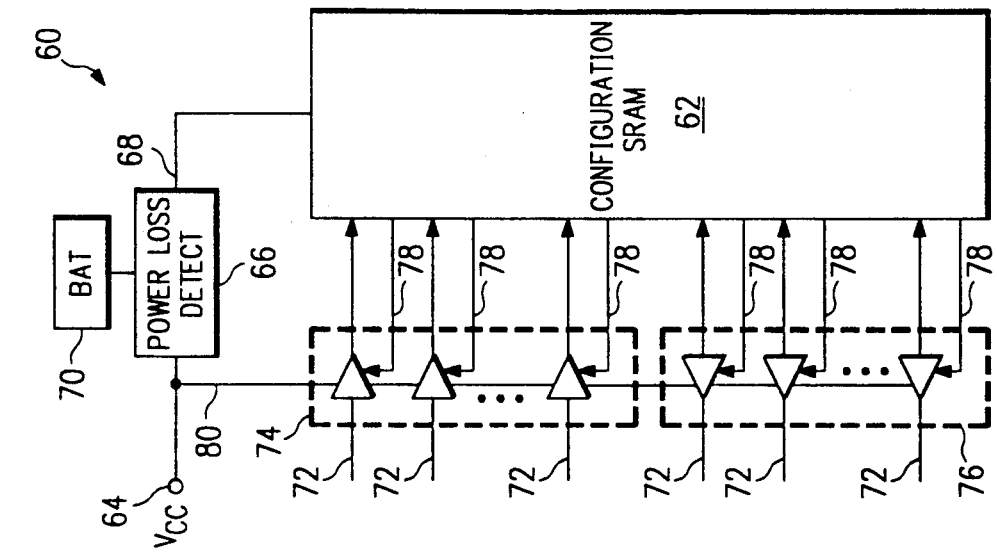
FIG. 3
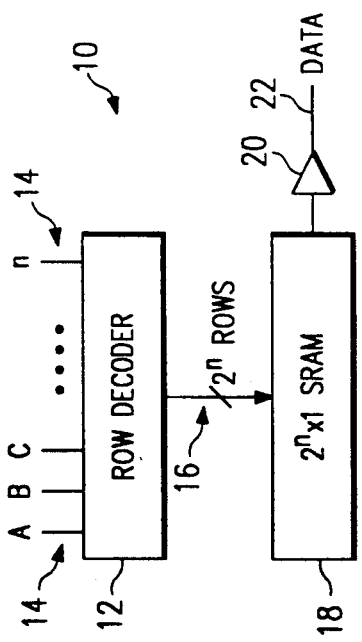
FIG. 1
FIG. 2

CONFIGURATION MEMORY FOR PROGRAMMABLE LOGIC DEVICE

CROSS-REFERENCE TO RELATED APPLICATIONS

The present application is a continuation-in-part of U.S. patent Ser. No. 414,712, filed Sep. 29, 1989, titled CONFIGURATION MEMORY FOR PROGRAMMABLE LOGIC DEVICE, by Randy C. Steele, which is assigned to the assignee hereof.

The present application contains subject matter in common with co-pending U.S. application Ser. No. 414,695, titled LOGIC BLOCK FOR PROGRAMMABLE LOGIC DEVICE, by Randy C. Steele, filed on Sep. 29, 1989, now issued as U.S. Pat. No. 4,975,601 and U.S. application Ser. No. 502,572, filed on even date herewith, titled SRAM BASED CELL FOR PROGRAMMABLE LOGIC DEVICES, by Randy C. Steele, both of which are assigned to the assignee hereof and both of which are hereby incorporated by reference hereinto.

BACKGROUND OF THE INVENTION

1. Field of the Invention

The present invention is related generally to integrated circuit devices, and more specifically to programmable logic devices.

2. Description of the Prior Art

Programmable logic devices are becoming increasingly popular in the electronics industry because of their flexibility. These devices allow a user to configure an integrated circuit chip, having a standard design, to perform the user's desired logic functions. Use of a standard design to perform many different logic functions greatly decreases the cost per logic gate compared to custom designs, especially at smaller volumes. If changes or updates are needed to the programmed logic function, some types of devices can be reprogrammed.

One time programmable logic devices are very common. The user can program the devices, or have them programmed late in the production cycle at the semiconductor foundry. Such parts provide a low cost, but cannot be reprogrammed. Typical one time programmable logic devices are programmed using a final metal mask or fusible links.

Reprogrammable devices use non-volatile memory to retain configuration information. This information is used to define the logic functions performed by the device, and to configure input and output buffers. Technologies commonly used for fabrication of such devices use EPROMS and EEPROMS for storage of configuration information. Since EPROMS are typically erased by exposing them to ultraviolet light, they are difficult to reprogram without physically removing the integrated circuit from the system. EEPROMS are easier to reprogram, but still require the use of special programming voltages in external circuitry suitable for performing the reprogramming process. Reprogramming and testing of both EPROMS and EEPROMS is relatively slow.

A few integrated circuit designs utilize static random access memories (SRAMs) for storage of configuration information. Use of RAMs to perform logic functions is well known in the art. One technique for using SRAMs in programmable logic devices is to provide an array of SRAM blocks interconnected by switching matrices. The switching matrices are also programmable, and are used to switch signals to various portions of the device.

A significant problem with the use of SRAM based programmable logic devices is the fact that these devices must be reconfigured whenever a system containing them is powered up. This requires that the system incorporating SRAM-based programmable logic devices includes some form of external non-volatile memory for storing configuration information and a mechanism for reloading such configuration information from the non-volatile memory into the programmable logic device on power up. These devices cannot retain their programming for later ready to use installation in a system.

It would be desirable to provide a programmable logic device which provide the flexibility of SRAM-based logic with the configuration retention properties of non-volatile memory devices.

SUMMARY OF THE INVENTION

It is therefore an object of the present invention to provide a programmable logic device which utilizes random access memory for performing logic functions.

It is a further object of the present invention to provide such a programmable logic device which will retain configuration information without requiring that power be applied to the integrated circuit device.

Therefore, according to the present invention, a programmable logic integrated circuit device utilizes volatile memory elements such as SRAM for retaining configuration information. A circuit is provided as part of the device for detecting loss of power on a supply input pin. When power loss is detected, a backup voltage supply, packaged with the programmable logic device as a unit, is connected thereto. The backup power is used to supply voltage only to those portions of the device having volatile memory elements containing configuration information. Backup power is not provided to input and output buffers of the device, thereby preventing excess loads being placed upon the backup device because of events which may occur external to the programmable logic device.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIG. 1 is a block diagram of an SRAM used to perform logic functions;

FIG. 2 is a block diagram of a portion of a programmable logic device utilizing the SRAM of FIG. 1;

FIG. 3 is a block diagram of a programmable logic device in accordance with the present invention.

DESCRIPTION OF THE PREFERRED EMBODIMENT

Figure 4:
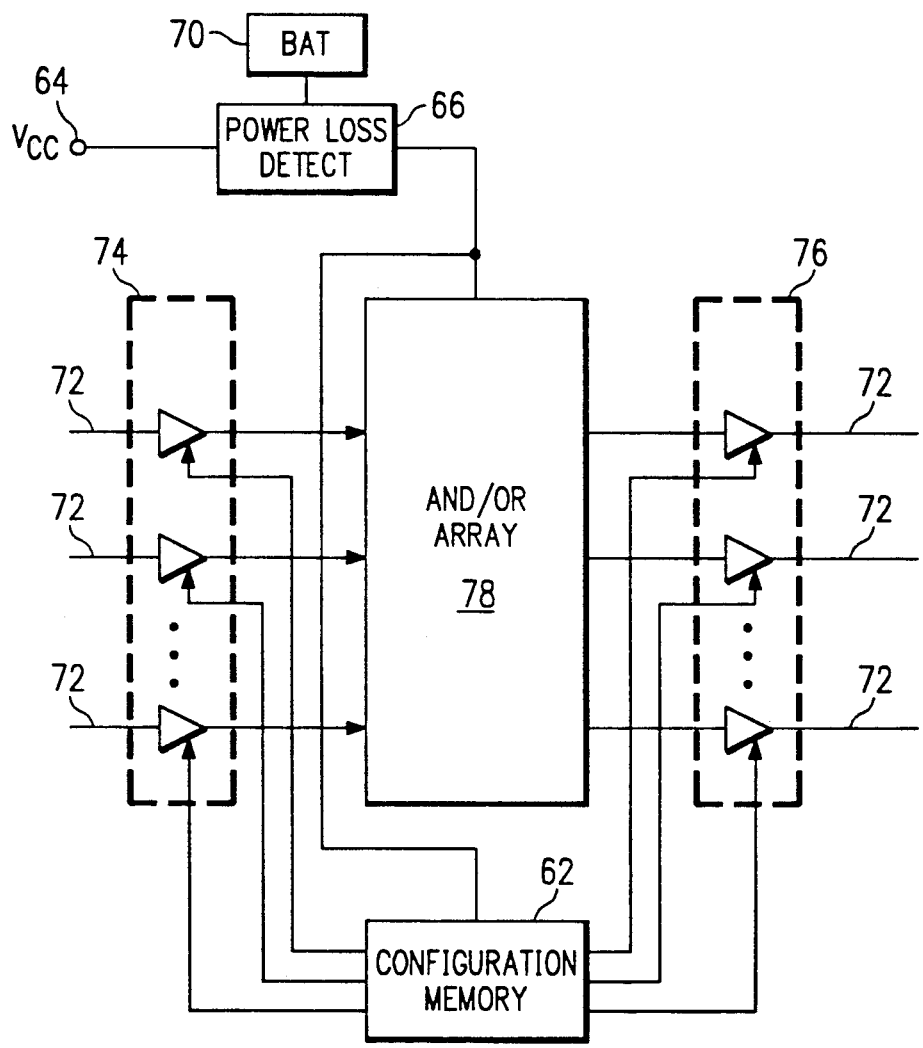
FIG. 4 is a block diagram of a programmable logic device in accordance with an alternative embodiment of the present invention.

FIG. 1 illustrates a block diagram for a logic block 10 suitable for use on programmable logic devices. These logic blocks 10 are typically referred to as macrocells. A plurality of macrocells 10 are typically used on a single programmable logic device, as will be described in more detail in connected with FIG. 2.

The macrocell 10 includes a row decoder 12 for decoding inputs presented on input lines 14. There are n input lines 14, and the row decoder 12 has $2^n$ output lines 16, with each output line corresponding to a row. Only one output line 16 is active at a time, with the active output line determined by the bit pattern presented to the row decoder 12 on the input lines 14.

A single column SRAM 18 contains $2^n$ bits. A sense amplifier 20 is connected to the SRAM 18, and generates a 1 bit DATA output signal on line 22. The SRAM 18 position to be coupled to the sense amp 20 is determined by the identity of the active row line 16, as known in the art.

The decoding of the input lines 14 provides an AND function, while the logic state stored at each location in the SRAM 18 provides an OR function. Therefore, loading data into the SRAM 18 performs the function of programming the macrocell 10 to perform a desired logic function. FIG. 1 shows an SRAM which generates a single bit output, but multiple bit outputs can be used instead. In addition, a single macrocell 10 can, if desired, contain multiple SRAMs 18 each having an associated row decoder 12. Using either of these techniques, alone or in combination, provides macrocells 10 having multiple output bits. Additional combinational and sequential logic (not shown) can be included in multiple output macrocells if desired.

Referring to FIG. 2, a portion of a programmable logic device incorporating macrocells is shown. Six identical macrocells 30-35 each have n inputs, and m outputs. The macrocells 30-35 are connected together by programmable switching matrices (PSMs) 36-46. Each programmable switching matrix includes transfer gates which couple signal lines together. Each programmable switching matrix has a number, k, of signal lines passing through it in addition to the input lines to and output lines from each macrocell. These lateral transfer lines pass signals from one programmable switching matrix to another, allowing signals to be transferred between physically non-adjacent portions of the device.

PSM 37 accepts input signals generated from off chip, and PSM 45 directs output signals off chip. Preferably, both input and output lines are buffered as will be described in connection with FIG. 3.

The signal lines routed through the various programmable switching matrices are non-directional, so that signals may pass through the programmable switching matrix in any direction. For example, the output signals from macrocell 31 can be passed through programmable switching matrix 41 to the inputs of macrocell 34, or to adjacent programmable switching matrices 40 and 42. As another example, an output signal from macrocell 34 could be used as an input signal to macrocell 32 by switching such signal through programmable switching matrices 45, 46, 43, and 38 in that order. An alternative route would be to switch the same signal through PSMs 45, 44, 39, 36, 37, and 38 in that order.

The switching performed within each programmable switching matrix is defined by a plurality of configuration bits contained therein. These configuration bits are stored in a small SRAM included as a part of each programmable switching matrix. Signal routing on the device can be changed merely by reprogramming the memories associated with each programmable switching matrix. Programmable switching matrices are known in the art, and can be found, for example, in part numbers XC2064 and XC2018, available from Xilinx.

Referring to FIG. 3, a programmable logic device generally referred to as 60 includes configuration SRAM 62. The configuration SRAM 62 is understood to include the SRAMs 18 within the various macrocells, and the configuration memory associated with each of the programmable switching matrices. As will be described further below, the configuration SRAM 62 also includes buffer configuration memory which defines the functions of the input/output pins of the device.

A power supply input pin 64 supplies power to the device 60 from the outside world. This input 64 is connected to a power loss detect circuit 66. A power supply line 68 is connected to the power loss detect circuit 66, and is used to supply power to all components in the configuration SRAM 62.

A power supply backup battery 70 is connected to the power loss detect circuit 66, and is preferably housed in the same integrated circuit package as the programmable logic device 60. The power loss detect circuit 66 connects the input pin 64 to power line 68 when voltage is present at the input pin 64. If the voltage at pin 64 drops below that necessary to sustain proper operation of the configuration SRAM 62, the power loss detect circuit connects the battery 70 to line 68. This allows the information contained in the configuration SRAM to be maintained even if power is removed from the device 60.

Various circuits are known for detecting power loss and connecting a backup battery to a device. These have been used in the past on memory devices. Examples of such circuits can be found in U.S. Pat. No. 4,713,555, entitled BATTERY CHARGING PROTECTION CIRCUIT; U.S. Pat. No. 4,122,359, entitled MEMORY PROTECTION ARRANGEMENT; and U.S. Pat. No. 4,451,742, entitled POWER SUPPLY CONTROL FOR INTEGRATED CIRCUIT.

The programmable logic device 60 preferably has a plurality of input/output pins 72 which can be programmed to function either as input pins or output pins. Each input/output pin 72 has one or more associated configuration bits within the configuration SRAM 62. These configuration bits are used to configure some input/output buffers to function as input buffers 74, with others being programmed to function as output buffers 76. The function of each buffer is controlled by the signal present on its associated buffer program line 78.

Operating power is supplied to the input buffers 74 and output buffers 76 through buffer supply voltage line 80. As can be seen in FIG. 3, voltage supply line 80 is connected directly to the input voltage pin 64. This means that, when $V_{cc}$ is at its normal operating value, all of the buffers 74, 76 operate normally. When the voltage $V_{cc}$ is removed, the power loss detect circuit 66 applies voltage to the configuration SRAM 62 from the battery 70 through power line 68. However, as known in the art, the power loss detect circuitry isolates the battery 70 and power line 68 from the input pin 64 in order to prevent the battery 70 from supplying power to the external world through supply voltage pin 64. This means that supply line 80 is also isolated from the battery 70.

Since voltage supply line 80 is isolated from the battery 70, buffers 74 and 76 do not function when the device 60 is operating in a battery backup mode. This mode of operation is preferred because external changes on the input/output pins 72 might cause current to be drawn by one or more buffers 74, 76, which would tend to rapidly deplete the battery 70. However, power continues to be supplied to the configuration bits for the input/output buffers, so that no reprogramming is necessary when power is restored to the device 60.

The configuration SRAM 62 is preferably designed using CMOS SRAM, so that the load on the backup battery 70 is very low. This allows a small battery 70 to be included as a unit with the packaging of the device 60, and the small battery 70 will not be drained when the device 60 is powered off.

The techniques described above can be used with programmable logic devices having designs other than that shown in FIG. 2. For example, configuration SRAM 78 can store the programmed information needed to define connections in a device having an AND-OR array. Once configuration information has been written to the device, it is retained in the configuration memory 78. Such information is retained after power is lost or removed in the manner described above. The input and output buffers 74, 76 are disconnected as described above to extend the life of the battery 70 in backup mode. An SRAM based design suitable for use in an AND-OR programmable logic device is described in copending U.S. application Ser. No. 502,572, filed on even date herewith, titled SRAM BASED CELL FOR PROGRAMMABLE LOGIC DEVICES, which is assigned to the assignee hereof and which is hereby incorporated by reference hereinto.

Any device which contains changeable configuration information can be handled in a similar manner. Reconfigureable microprocessors and microcontrollers as well as the broad spectrum of products which are referred to generally by the term programmable logic device can make use of the present invention. The memory which is used to store the configuration information is preferably stored in CMOS SRAM for extended battery life, and all remaining parts of the device can be disconnected for the same reason.

As will be appreciated by those skilled in the art, a programmable logic device such as described above may be easily reconfigured as often as desired. Any desired configuration is retained permanently within the device, since the configuration memory elements of the configuration SRAM are always powered by the backup battery 70 whenever power is not supplied to the device. This means that it is not necessary to provide a separate non-volatile memory containing configuration information for the device, nor is it necessary to provide circuitry for reloading information into the device each time power is applied to it.

Since SRAM technology is used for logic functions, user writable memory can also be incorporated into the programmable logic device. Such memory would also preferably be powered by the backup supply, so that user data would be retained through a power loss.

While the invention has been particularly shown and described with reference to a preferred embodiment, it will be understood by those skilled in the art that various changes in form and detail may be made therein without departing from the spirit and scope of the invention.

What is claimed is:

1. A programmable logic device, comprising:
    an AND-OR array for generating logic outputs as a function of logic inputs thereto;
    a plurality of input/output buffers connected to said AND-OR array and to input/output pins of the device, wherein said input/output buffers are programmable to function as either input or output buffers based on the value of an input control signal;
    a power detect circuit for detecting when power to the device through an input power pin is removed;
    a backup battery connected to said power detect circuit for providing power to selected portions of the device when a power removal is detected, wherein said input/output buffers are not provided with backup power from said battery when a power removal is detected; and
    a volatile memory cell connected to each of said input/output buffers to provide the input control signals thereto, a value stored in each of such volatile memory cell determining whether the connected input/output buffer functions as an input buffer or an output buffer, said volatile memory cells further being connected to said backup battery through said power detect circuit when a power removal is detected, whereby the values stored in said volatile memory cells is retained when power is removed from the power input pin.

2. The programmable logic device of claim 1, wherein said volatile memory cells comprise SRAM memory cells.

3. A method for retaining configuration information in a programmable logic device, comprising the steps of:
    storing AND-OR array programming information in an array of volatile memory cells to define logic functions of the device;
    storing a plurality of input/output direction bits in direction bit volatile memory cells;
    causing a plurality of input/output buffers associated with said input/output direction bits to function as either input or output buffers according to a value stored in the associated direction bit volatile memory cell;
    detecting an occurrence of a loss of power to the device;
    when a loss of power is detected, supplying power to the array of volatile memory cells and to the direction bit volatile memory cells from a backup battery attached to the device, wherein the values stored therein are retained during the loss of power; and
    when the loss of power is detected, preventing supply of power to the input/output buffers from the backup battery.

4. The method of claim 3, wherein the array of volatile memory cells and the direction bit volatile memory cells are all SRAM cells.

* * * * *